United States Patent
Chan et al.

(10) Patent No.: US 6,849,940 B1
(45) Date of Patent: Feb. 1, 2005

(54) INTEGRATED CIRCUIT PACKAGE FOR THE TRANSFER OF HEAT GENERATED BY THE INTE CIRCUIT AND METHOD OF FABRICATING SAME

(75) Inventors: Vincent K. Chan, Richmond Hill (CA); Samuel W. Ho, Toronto (CA)

(73) Assignee: ATI Technologies, Inc., Thornhill (CA)

(*) Notice: Subject to any disclaimer, the term of this patent is extended or adjusted under 35 U.S.C. 154(b) by 0 days.

(21) Appl. No.: 09/716,734

(22) Filed: Nov. 20, 2000

(51) Int. Cl.[7] .................. H01L 23/28; H01L 23/22; H01L 23/10; H05K 7/20
(52) U.S. Cl. .............. 257/706; 257/712; 257/710; 257/704; 257/713; 257/717; 257/720; 257/675; 257/777; 257/686; 257/723; 257/788; 257/787; 257/678; 257/707; 361/704; 361/702; 361/703
(58) Field of Search ................ 257/706, 707, 257/712, 713, 717, 720, 675, 686, 723, 777, 704, 710, 788, 787, 678, 685, 684, 784, 728, 737, 738, 734, 725, 718, 223, 786, 778, 796; 361/704, 702, 703, 725, 717, 718, 715; 165/203

(56) References Cited

U.S. PATENT DOCUMENTS

| | | | | | |
|---|---|---|---|---|---|
| 5,424,573 A | * | 6/1995 | Kato et al. | ................ | 257/431 |
| 5,616,957 A | * | 4/1997 | Kajihara | ................ | 257/712 |
| 5,977,626 A | * | 11/1999 | Wang et al. | ................ | 257/707 |
| 6,414,385 B1 | * | 7/2002 | Huang et al. | ................ | 257/690 |
| 6,437,984 B1 | * | 8/2002 | Chiu et al. | ................ | 361/704 |
| 6,608,763 B1 | * | 8/2003 | Burns et al. | ................ | 361/790 |
| 6,703,698 B2 | * | 3/2004 | Huang et al. | ................ | 257/678 |
| 6,734,552 B2 | * | 5/2004 | Combs et al. | ................ | 257/707 |
| 2001/0008776 A1 | * | 7/2001 | Lai et al. | ................ | 438/106 |
| 2002/0175421 A1 | * | 11/2002 | Kimura | ................ | 257/778 |
| 2002/0195270 A1 | * | 12/2002 | Okubora et al. | ................ | 174/260 |

FOREIGN PATENT DOCUMENTS

| | | | | |
|---|---|---|---|---|
| JP | 60-154648 | * | 8/1985 | ............ 257/796 |
| JP | 62-281435 | * | 12/1987 | ............ 29/827 |
| JP | 08-250652 | * | 9/1996 | |

* cited by examiner

Primary Examiner—Alexander Oscar Williams
(74) Attorney, Agent, or Firm—Vedder Price Kaufman & Kammholz, P.C.

(57) ABSTRACT

An integrated circuit package includes a first or active substrate and a second or passive substrate. The active substrate includes at least one circuit that generates heat during circuit operation. The passive substrate does not include any heat-generating circuits, although the passive substrate may include passive, disabled or dormant circuitry. The two substrates are preferably fabricated of semiconductor material and have substantially equal coefficients of thermal expansion. The passive substrate is thermally coupled to the active substrate preferably using a thin layer of adhesive, such as an epoxy. The passive substrate serves to thermally conduct the heat generated by the circuits of the active substrate away from the active substrate. An internal metallic heat sink may be optionally thermally coupled to the passive substrate to further aid in the transfer of heat away from the active substrate.

12 Claims, 4 Drawing Sheets

US 6,849,940 B1

INTEGRATED CIRCUIT PACKAGE FOR THE TRANSFER OF HEAT GENERATED BY THE INTE CIRCUIT AND METHOD OF FABRICATING SAME

FIELD OF THE INVENTION

The invention relates generally to integrated circuit (IC) packages and, more particularly, to an IC package and method of fabrication that eliminate the need for thermal expansion-matching epoxy with poor thermal conductivity characteristics to couple the IC package's semiconductor substrate to a heat sink.

BACKGROUND OF THE INVENTION

As is known, integrated circuits (ICs) are devices that include a multitude of transistors and other active circuits arranged and configured on a semiconductor substrate, such as silicon or gallium arsenide, to perform certain functions. During operation of an IC, the active circuits in the IC generate heat. Packages that hold the ICs typically include elements, such as heat sinks, intended to transfer much of the generated heat away from the active circuits. Failure to transfer the heat can result in undesired changes in IC performance or, worse yet, IC failure.

A cross section of a typical IC package 100 is depicted in FIG. 1. The IC package 100 includes a semiconductor substrate 101 or die, an adhesive layer 103, an internal printed circuit board (PCB) substrate 105, an internal epoxy molding material 107, an internal heat sink 109, and an external epoxy molding material 111. The semiconductor substrate 101 includes multiple active circuits 113 (e.g., transistors) that are connected to conductive traces 115 on the internal PCB substrate 105 via wire bonds 117 or other electrically conductive paths. For example, in flip chip technology, the semiconductor substrate 101 is flipped over (hence the name "flip chip") such that the connecting terminals of the active circuits 113 can be directly soldered or otherwise connected (e.g., through the use of conductive epoxy) to the conductive traces 115 or pads of the internal PCB substrate 105, thereby eliminating the need for the wire bonds 117 and the adhesive layer 103 connecting the semiconductor substrate 101 to the internal PCB substrate 105. The IC package 100 typically further includes solder balls 119 to allow the IC package 100 to be wave soldered or otherwise electrically connected to conductive traces or pads 121 of an external printed circuit board 123. The IC package 100 depicted in FIG. 1 is typically referred to as a plastic ball grid array (PBGA) package.

The adhesive layer 103 is typically a thin layer of conductive epoxy used to position the semiconductor substrate 101 in a fixed relationship to the PCB substrate 105 using known die attachment techniques. The internal epoxy molding material 107 is used to keep the wire bonds 117 from coming into contact with the internal heat sink 109 and to match the coefficient of thermal expansion (CTE) of the semiconductor substrate 101 to the CTE of the internal heat sink 109. As mentioned above, the internal heat sink 109 is included to transfer or conduct heat generated by the active circuits 113 of the semiconductor substrate 101 away from the semiconductor substrate 101. The internal epoxy molding material 107 is typically an epoxy resin with relatively poor thermal conduction properties as compared to the internal heat sink 109 (which is typically copper or aluminum) or the semiconductor substrate 101 (which is typically silicon or gallium arsenide). Typically, the thermal conductivity of the internal epoxy molding material 107 is four hundred (400) to four hundred fifty (450) times worse than the thermal conductivity of the internal heat sink 109 and one hundred fifty (150) to one hundred sixty (160) times worse than the thermal conductivity of the semiconductor substrate 101. Thus, the internal epoxy molding material 107 serves as a substantial barrier to the rapid and efficient transfer of heat away from the semiconductor substrate 101.

One prior art technique for reducing the thickness of the internal epoxy molding material 107 to improve heat transfer from the semiconductor substrate 101 to the internal heat sink 109 is depicted in cross section in the IC package 200 of FIG. 2. As illustrated in FIG. 2, the configuration of the internal heat sink 201 has been changed to include a downward extrusion in a center portion of the heat sink 201 to reduce the thickness of the internal epoxy molding material 107 and, accordingly, the distance the heat generated by the semiconductor substrate 101 must travel to reach the heat sink 201. Although such a change in the configuration of the heat sink 201 improves heat transfer, the extruded heat sink 201 is costly and there still exists a poor thermal conduction layer between the semiconductor substrate 101 and the heat sink 201.

Another alternative is to directly connect the extruded part of the heat sink 201 to the semiconductor substrate 101 using a very thin, thermally conductive adhesive (e.g., conductive epoxy, such as is used for die attachment). Although such a direct connection would provide optimal heat transfer, mismatches in the CTEs of the heat sink 201 and the semiconductor substrate 101 would result in poor reliability of the IC package 200 over temperature (e.g., the semiconductor substrate 101 would likely crack over time due to the mismatches in CTE). Also, the metal heat sink 201 may short circuit or otherwise negatively impact the performance of the circuits 113 disposed on the semiconductor substrate 101 if the heat sink 201 is directly connected to the substrate 101.

Vertical stacking of active semiconductor substrates is also known for reducing the printed circuit board area for a particular amount of functionality. An exemplary IC 300 that utilizes vertical stacking is depicted in cross section in FIG. 3. As shown in FIG. 3, two semiconductor substrates 301, 303 are stacked vertically. Each semiconductor substrate 301, 303 includes respective active or heat-generating circuits 305, 307. The active circuits 305, 307 are connected to respective traces or pads 309, 311 on a PCB substrate 313 via wire bonds 315, 317 or equivalent conductive paths. The two substrates 301, 303 are connected together via a thin, electrically non-conductive adhesive layer 319, such as epoxy, and the lower substrate 303 is connected to the PCB substrate 313 via a thin adhesive layer 321 that may be electrically conductive (e.g., conductive epoxy) or electrically non-conductive (e.g., epoxy). The adhesive layer 319 connecting the two substrates 301, 303 together can be very thin because, in most cases, the CTEs of the two substrates 301, 303 are substantially identical (i.e., the two substrates 301, 303 are typically the same (e.g., both silicon or both gallium arsenide)). Although not depicted in FIG. 3, the IC 300 is typically encased by an internal epoxy molding material, an internal heat sink, and an external epoxy molding material as discussed above with respect to FIGS. 1 and 2. Thus, although known for providing increased functionality in a fixed PCB area, vertical stacking of multiple heat-generating semiconductor substrates 301, 303 provides no improvement in transferring the heat generated by the semiconductor substrates 301, 303 away from the substrates 301, 303.

Therefore, a need exists for an integrated circuit package and corresponding method of fabrication that improve the transfer of heat generated by an integrated circuit away from the integrated circuit, without sacrificing package reliability.

DETAILED DESCRIPTION OF A PREFERRED EMBODIMENT

Generally, the present invention encompasses an integrated circuit (IC) package and a corresponding method of fabrication. The IC package includes a first or active substrate and a second or passive substrate. The active substrate includes at least one circuit that generates heat during circuit operation. The passive substrate does not include any heat-generating circuits, although the passive substrate may include passive, disabled or dormant circuitry. The two substrates, which preferably comprise semiconductor substrates, have substantially equal coefficients of thermal expansion (CTEs). The passive substrate is thermally coupled to the active substrate preferably using a thin layer of adhesive, such as epoxy. The passive substrate serves to thermally conduct the heat generated by the circuits of the active substrate away from the active substrate and the circuits. An internal metallic heat sink may be optionally thermally coupled to the passive substrate to further aid in the transfer of heat away from the active substrate. By thermally coupling a second, passive substrate to an active substrate in this manner, the present invention provides improved thermal heat transfer as compared to prior art IC packages that include a layer of poor thermally conducting epoxy between the active substrate and the internal heat sink. In addition, the IC package of the present invention maintains package reliability over temperature through the use of a heat spreader with a coefficient of thermal expansion (CTE) that substantially matches the CTE of the active substrate, in contrast to the poor thermal reliability and IC performance degradation that could result from connecting an internal metallic heat sink directly to an active semiconductor substrate.

Figure 1:
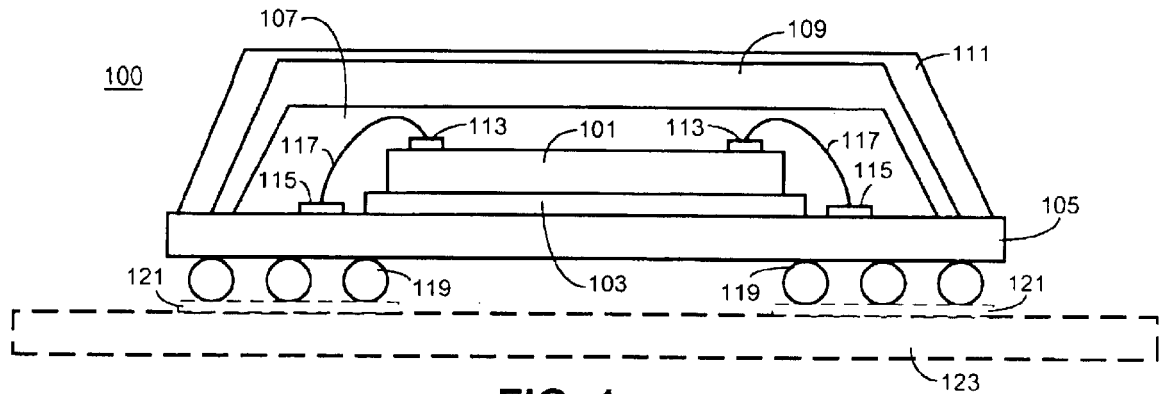
FIG. 1 is a cross-sectional view of a prior art integrated circuit package in which poor thermal conducting epoxy provides the thermal coupling from a semiconductor substrate to an internal heat sink.
Figure 2:
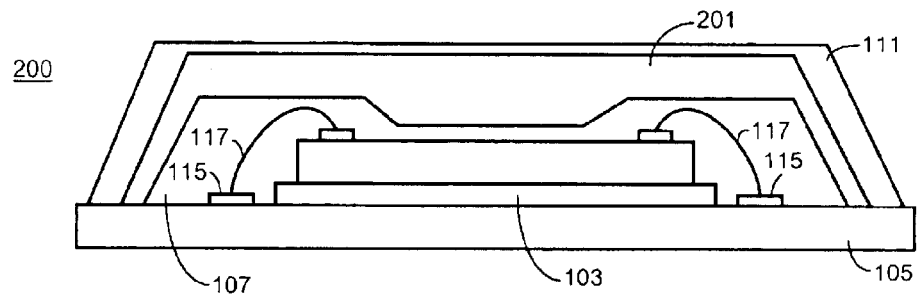
FIG. 2 is a cross-sectional view a prior art integrated circuit package similar to the integrated circuit package of FIG. 1, except that the internal heat sink has been reconfigured to reduce the thickness of the epoxy coupling the semiconductor substrate to the internal heat sink.
Figure 3:
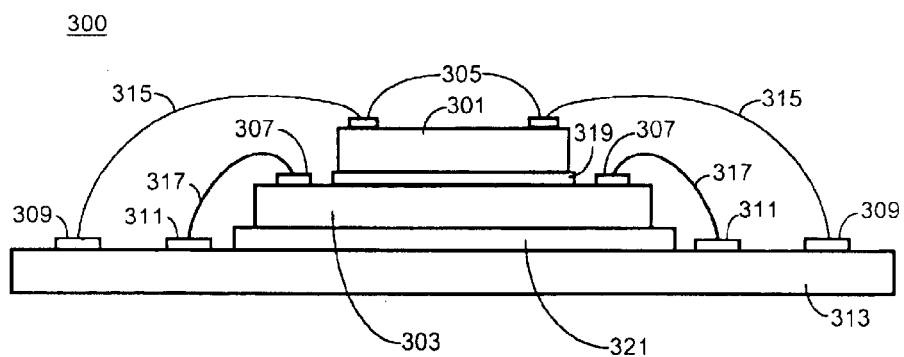
FIG. 3 is a cross-sectional view of a prior art integrated circuit package in which two active semiconductor substrates are vertically stacked to provide extra functionality while requiring less printed circuit board space.
Figure 4:
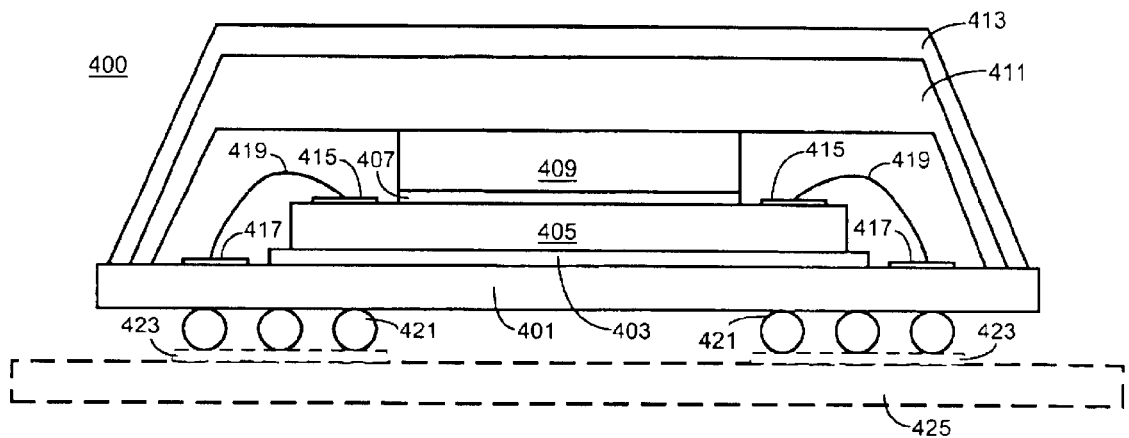
FIG. 4 is a cross-sectional view of an integrated circuit package containing a single integrated circuit in accordance with a preferred embodiment of the present invention.

The present invention can be more fully understood with reference to FIGS. 4–8, in which like reference numerals designate like items. FIG. 4 is a cross-sectional view of an IC package 400 containing a single IC in accordance with a preferred embodiment of the present invention. The preferred IC package 400 includes a printed circuit board (PCB) substrate 401, a first adhesive layer 403, a first substrate 405, a second adhesive layer 407, and a second substrate 409. The IC package may optionally further include an internal metallic heat sink 411 and an external epoxy molding material 413. Substrate 405 includes at least one active circuit 415 that generates heat during its operation. Accordingly, substrate 405, and every other substrate that includes heat-generating circuits, will be referred to herein as an "active substrate." By contrast, substrate 409 does not include any heat-generating circuits, although it may include passive circuits or dormant (unused) circuits. Accordingly, substrate 409, and every other substrate that excludes heat-generating circuits, will be referred to herein as a "passive substrate."

The PCB substrate 401 may be any printed circuit board material now known or developed in the future that is or may be used as a PCB substrate in IC packages. For example, the PCB substrate 401 may be a bizmalemide triazine (BT) resin substrate, such as a readily-available FR4 substrate, a ceramic substrate, a cyanate ester substrate, or any other organic printed circuit board substrate.

The substrates 405, 409 are preferably semiconductor materials characterized by substantially equal CTEs. In the preferred embodiment, the semiconductor substrates 405, 409 are the same material. For example, both semiconductor substrates 405, 409 may be silicon, gallium arsenide or silicon germanium. In an alternative embodiment, the semiconductor substrates 405, 409 may be different materials provided that the CTEs of the two substrates 405, 409 are substantially equal (e.g., within about twenty percent (20%) of each other). In yet another embodiment, the substrates 405, 409 may be fabricated from organic compound materials, such as polyacetylene, polypyrrole, polythiophene, polyaniline, or hydroxyquinoline aluminum, or from any other non-metallic or semi-conducting substrate materials that have substantially equal CTEs. For the remainder of this description, active and passive substrates, such as substrates 405 and 409, will be referred to herein as semiconductor substrates in accordance with the preferred embodiment.

In a preferred embodiment, the height or thickness of the passive semiconductor substrate 409 is greater than the height or thickness of the active semiconductor substrate 405 to provide a greater volume through which to spread or conduct the heat generated by the circuits 415 of the active semiconductor substrate 405. However, the thickness of the passive semiconductor substrate 409 will typically be limited by the particular dimensions of the overall IC package 400. For example, in an IC package 400 that includes an internal heat sink 411, the thickness of the passive semiconductor substrate 409 will typically be substantially equal to the thickness of the active semiconductor substrate 405. In one such embodiment, the thickness of the semiconductor substrates 405, 409 may be approximately 0.320 millimeters. On the other hand, if the IC package 400 does not include an internal heat sink 411, the thickness of the passive semiconductor substrate 409 may be two to three times greater than the thickness of the active semiconductor substrate 405.

Adhesive layer 403 is preferably a thin layer (e.g., approximately 0.030 to 0.050 millimeters thick) of conductive epoxy that serves to physically and electrically connect the active semiconductor substrate 405 to the PCB substrate 401, and further serves to position the active semiconductor substrate 405 in a fixed relation with respect to the PCB substrate 401. In particular, the bottom surface of adhesive layer 403 is physically connected to the top surface of the PCB substrate 401 and the top surface of adhesive layer 403 is physically connected to the bottom surface of the active semiconductor substrate 405.

Adhesive layer 407 is preferably a thin layer of epoxy or any equivalently thermally conductive material that serves to thermally couple the active semiconductor substrate 405 to the passive semiconductor substrate 409, and further serves to position the active semiconductor substrate 405 in a fixed relation with respect to the passive semiconductor substrate 409. In particular, the bottom surface of adhesive layer 407 is physically connected to the top surface of the active semiconductor substrate 405 and the top surface of adhesive layer 407 is physically connected to the bottom surface of the passive semiconductor substrate 409. In order to facilitate substantial and rapid heat transfer from the active semiconductor substrate 405 to the passive semiconductor substrate 409, the thickness of adhesive layer 407 is less than or equal to approximately one-sixth of the thickness of the active semiconductor substrate 405. In a preferred embodiment, the thickness of adhesive layer 407 is less than or equal to approximately 0.050 millimeters.

The internal metallic heat sink 411, when used, is thermally coupled to the top surface of the passive semiconductor substrate 409 in such a manner as to accommodate movement of the metallic heat sink 411 with respect to the passive semiconductor substrate 409 over temperature. The heat sink 411 is preferably fabricated of copper, aluminum, or any other metal. Consequently, the heat sink 411 has a CTE that is substantially different than the CTE of the semiconductor substrates 405, 409. For example, when copper or aluminum is used for the heat sink 411, the CTE of the heat sink 411 is approximately seven (7) times greater than the CTE of the semiconductor substrates 405, 409. The heat sink 411 is thermally coupled to the passive semiconductor substrate 409 by the external epoxy molding material 413. That is, the external epoxy molding material 413 functions to press the heat sink 411 against the passive semiconductor substrate 409 with little or no air gap between the heat sink 411 and the substrate 409. The internal metallic heat sink 411 is used in the preferred IC package 400 to provide further thermal conduction and heat spreading for the heat generated by the active semiconductor substrate 405. The heat sink 411, when used, is preferably attached to the top surface of the PCB substrate 401 using any known method, such as through the use of an adhesive (e.g., a conductive epoxy). The preferred IC package 400 also includes the external epoxy molding material 413 to provide physical and environmental protection to the heat sink 411 and the rest of the IC package components, and to provide the compressive force necessary to thermally couple the internal heat sink 411 to the passive semiconductor substrate 409.

As mentioned above, the active semiconductor substrate 405 includes one or more heat-generating circuits 415. Such circuits may include integrated circuit transistors or any other active IC elements. The heat-generating circuits 415 are connected to conductive (e.g., copper or silver) pads or traces 417 on the PCB substrate 401 through one or more electrically conductive paths, such as wire bonds 419 or solder layers (e.g., when the active semiconductor substrate 405 and the PCB substrate 401 are in a flip chip arrangement). The IC package 400 may also include solder balls 421 to enable the IC package 400 to be wave soldered or reflow soldered onto conductive traces or pads 423 of a much larger printed circuit board 425.

During operation of the IC, the passive semiconductor substrate 409 functions to thermally conduct heat generated by the active circuit or circuits 415 of the active semiconductor substrate 405 away from the active semiconductor substrate 405 and, therefore, away from the active circuit or circuits 415. Since the passive semiconductor substrate 409 has a much higher thermal conductivity than the internal epoxy molding material of prior art IC packages (e.g., 140 Watts per meter degree Kelvin (W/m°K) for silicon vs. 0.9 W/m°K for a typical internal epoxy molding material), the IC package 400 of the present invention provides a substantial heat transfer improvement over prior art IC packages. In addition, since the CTE of the passive semiconductor substrate 409 is identical or at least substantially equal to the CTE of the active semiconductor substrate 405, the IC package 400 of the present invention provides enhanced heat spreading without sacrificing package reliability.

Figure 5:
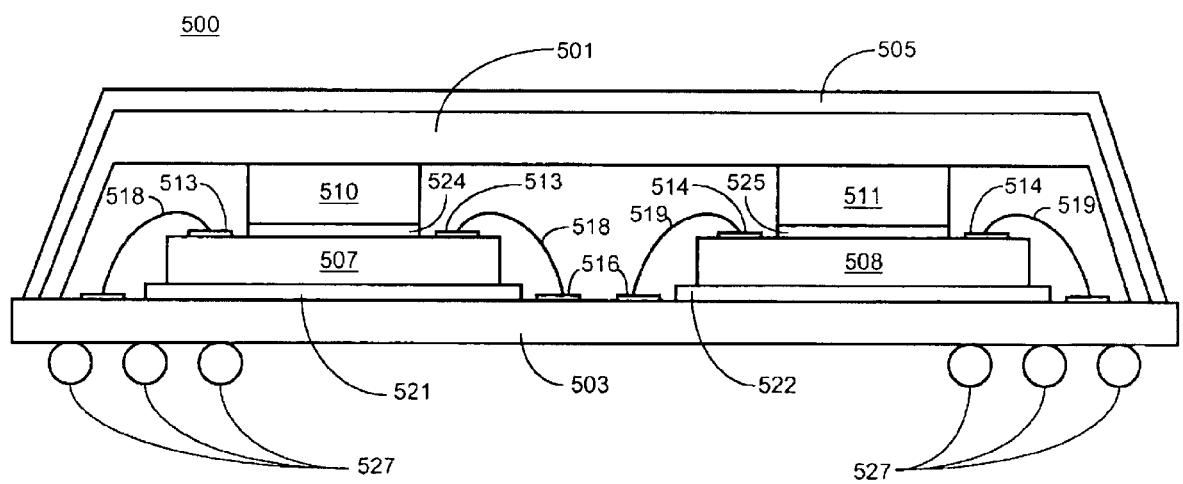
FIG. 5 is a cross-sectional view of an integrated circuit package containing multiple integrated circuits in accordance with an alternative embodiment of the present invention.

FIG. 5 is a cross-sectional view of an IC package 500 in accordance with an alternative embodiment of the present invention. This IC package 500 includes multiple ICs (two shown), an optional internal metallic heat sink 501, a common or shared PCB substrate 503, and an optional external epoxy molding material 505. Each IC includes an active semiconductor substrate 507, 508, a passive semiconductor substrate 510, 511, an adhesive layer 521, 522 attaching the active semiconductor substrate 507, 508 to the shared PCB substrate 503, and an adhesive layer 524, 525 attaching the passive semiconductor substrate 510, 511 to the active semiconductor substrate 507, 508. As discussed above with respect to FIG. 4, each active semiconductor substrate 507, 508 includes at least one heat-generating circuit 513, 514. Each heat-generating circuit 513, 514 is electrically connected to a corresponding electrically conductive pad or trace 516 of the shared PCB substrate 503 via a respective electrically conductive path, such as a wire bond 518, 519 or a solder layer (eg., when the active semiconductor substrate 507, 508 and the shared PCB substrate 503 are in a flip chip arrangement). The IC package 500 may also include solder balls 527 to enable the IC package 500 to be wave soldered or reflow soldered onto conductive traces or pads of a much larger printed circuit board.

In this multi-chip IC package 500, both the heat sink 501 (when used) and the PCB substrate 503 are shared among the ICs. The heat sink 501 in this embodiment may need to be thicker than the heat sink 411 in the single chip package 400 of FIG. 4 depending on the anticipated amount of heat that may be collectively generated by the active semiconductor substrates 507, 508 and/or the overall dimensions of the multi-chip IC package 500. The heat sink 501, when used, is preferably thermally coupled to (e.g., compressed against) the passive semiconductor substrates 510, 511 by the compression force of the external epoxy molding material 505.

The IC package 400 of FIG. 4 is the preferred single chip package for a PBGA-type of IC package in accordance with the present invention; whereas, the IC package 500 of FIG. 5 is the preferred corresponding multi-chip package. One of ordinary skill in the art will appreciate that flip chip type packages may also beneficially employ the use of passive semiconductor substrates 409, 510, 511 to improve heat transfer in accordance with the present invention.

Figure 6:
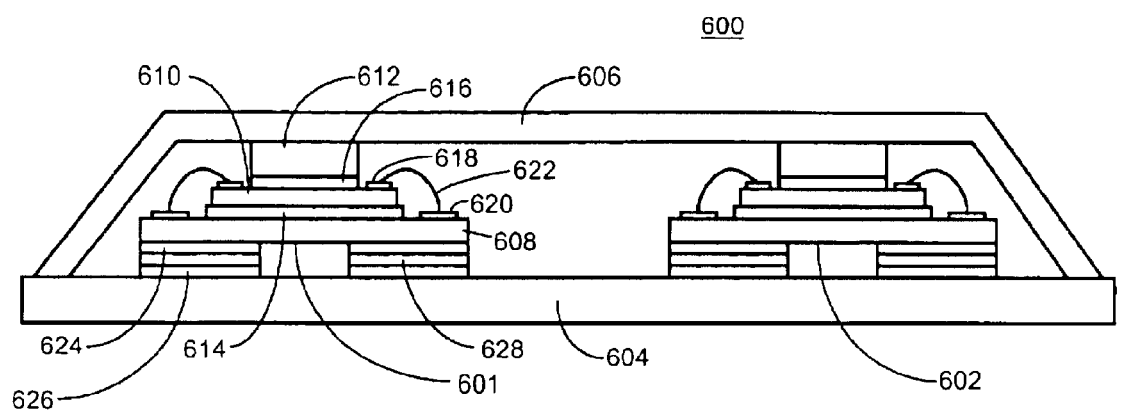
FIG. 6 is a cross-sectional view of a printed circuit board arrangement containing multiple integrated circuit packages in accordance with an alternative embodiment of the present invention.

FIG. 6 is a cross-sectional view of a PCB arrangement 600 containing multiple ICs 601, 602 (two shown) in accordance with an alternative embodiment of the present invention. In accordance with the PCB arrangement 600, each IC 601, 602 includes a PCB substrate 608, two adhesive layers 614, 616, an active semiconductor substrate 610, and a passive semiconductor substrate 612. Each IC 601, 602 also includes electrically conductive paths (wire bonds 622 in FIG. 6) to electrically connect the heat-generating circuits 618 of the active semiconductor substrate 610 to the conductive traces 620 or pads of the PCB substrate 608. In addition to containing multiple ICs 601, 602, the PCB arrangement 600 further includes a shared PCB 604 and a shared metallic heat sink 606. The passive semiconductor substrate 612 of each IC 601, 602 is thermally coupled to the heat sink 606 as described in detail above.

The PCB substrate 608 of each IC 601, 602 is soldered or otherwise electrically coupled to (e.g., through a conductive epoxy) the PCB 604. To facilitate the electrical coupling of each PCB substrate 608 to the PCB 604, each PCB substrate 608 preferably includes electrically conductive receptacle areas 624 (e.g., copper pads) on the substrate's bottom surface and the PCB 604 includes matching electrically conductive receptacle areas 626 (e.g., copper pads) on the PCB's top surface. Solder paste or conductive epoxy is placed on either receptacle area 624, receptacle area 626, or both, and the PCB arrangement 600 is wave soldered or reflowed, or properly cured, such that an electrically conductive layer 628 is formed between the receptacle areas 624, 626. The heat sink 606 is preferably attached to the top surface of the PCB 604 using any known method, such as soldering or through use of an adhesive, such as a conductive epoxy. Also, since the heat sink 606 in this embodiment is shared by the ICs 601, 602, the heat sink 606 may need to be thicker than the heat sink 411 in the single chip package 400 of FIG. 4 depending on the anticipated amount of heat that may be collectively generated by the active semiconductor substrates 612 and/or the overall dimensions of the PCB arrangement 600.

Further, as described above, the heat sink 606 is preferably thermally coupled to the passive semiconductor substrates 612 in such a manner as to accommodate movement of the heat sink 606 with respect to the passive semiconductor substrates 612 over temperature. Such movement may result due to the substantial differences between the CTEs of the passive semiconductor substrates 612 and the CTE of the metallic heat sink 606.

The semiconductor substrates 610, 612, the adhesive layers 614, 616, and the PCB substrate 608 of each IC 601, 602 are preferably fabricated from the materials identified above with respect to FIGS. 4 and 5. Accordingly, the semiconductor substrates 610, 612 have substantially equal CTEs, and the passive semiconductor substrate 612 functions to thermally conduct heat away from the active semiconductor substrate 610 without jeopardizing the reliability of the PCB arrangement 600 or the individual ICs 601, 602.

Figure 7:
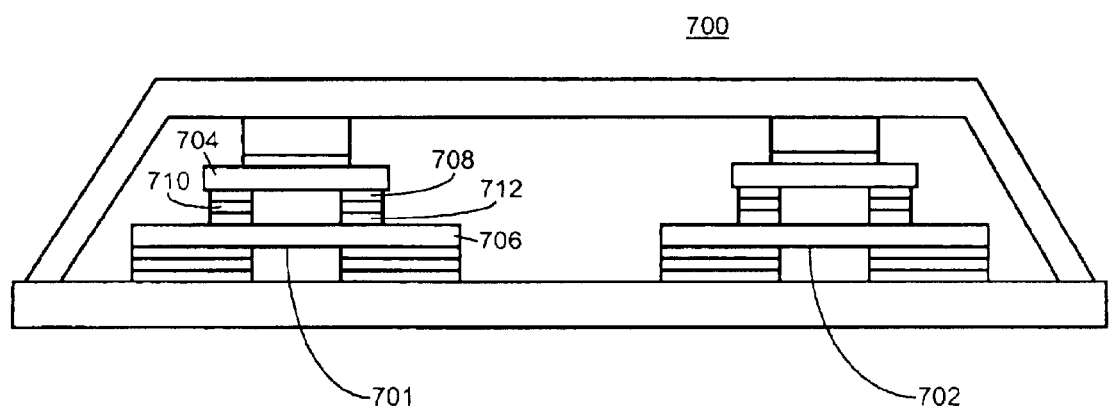
FIG. 7 is a cross-sectional view of an alternative printed circuit board arrangement containing multiple integrated circuit packages in accordance with yet another embodiment of the present invention.

FIG. 7 is a cross-sectional view of an alternative PCB arrangement 700 containing multiple ICs 701, 702 (two shown) in accordance with yet another embodiment of the present invention. The PCB arrangement 700 of FIG. 7 is substantially identical to the PCB arrangement of FIG. 6, except that the electrically conductive paths coupling the heat-generating circuits 708 of the active semiconductor substrates 704 to the conductive traces 712 or pads of the PCB substrates 706 are solder layers 710 instead of wire bonds. Thus, FIG. 7 illustrates a PCB arrangement 700 in which flip chip technology is used to electrically couple the active semiconductor substrates 704 to the PCB substrates 706. Similar flip chip technology may be employed to electrically couple the active semiconductor substrates to the PCB substrates in any one or more of the IC packages and PCB arrangements described above with respect to FIGS. 4–6.

Figure 8:
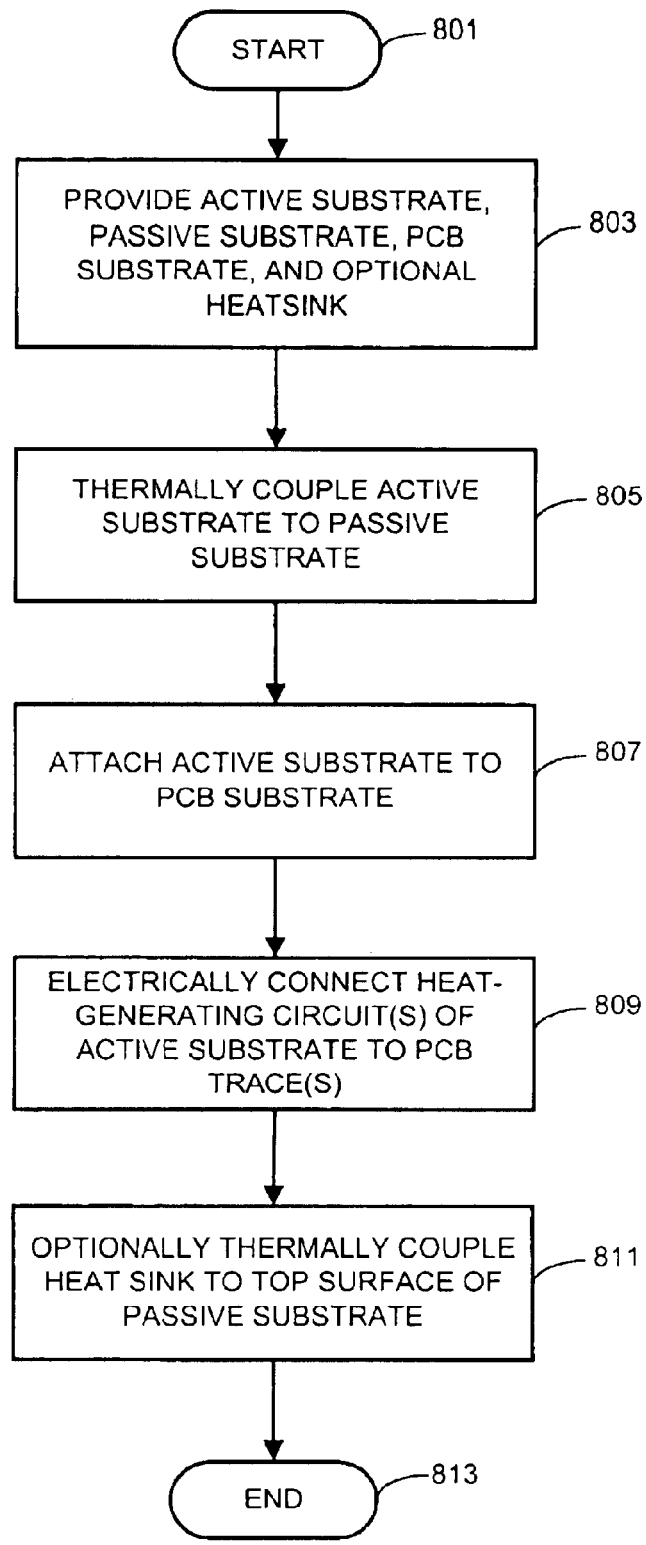
FIG. 8 is a logic flow diagram of steps executed to fabricate an integrated circuit package in accordance with the present invention.

FIG. 8 is a logic flow diagram 800 of steps executed to fabricate an integrated circuit package in accordance with the present invention. The logic flow begins (801) when at least one active substrate, at least one passive substrate, at least one PCB substrate, and at least one optional heat sink are provided (803). The active substrate(s) is preferably provided by fabricating a semiconductor wafer containing several active substrates and separating each active substrate from the wafer using known semiconductor fabrication techniques. The passive substrate(s) is preferably provided by fabricating a semiconductor wafer containing several blank substrates (i.e., substrates with no active or passive circuitry) and separating each blank substrate from the wafer using known semiconductor fabrication techniques. Alternatively, the passive substrate(s) may be provided by fabricating a semiconductor wafer that includes passive circuits or other circuits that will not be used during operation of the IC. Thus, the passive substrate(s) is fabricated such that it will not generate any heat during operation of the IC. The PCB substrate(s) and the heat sink are also fabricated using known techniques. Once fabricated, the active and passive substrates are preferably characterized by CTEs that are substantially equal; whereas, the CTE of the heat sink (when used) is substantially different (typically much greater) than the CTEs of the substrates. The active and passive substrates may be alternatively fabricated from organic compound materials, such as polyacetylene, polypyrrole, polythiophene, polyaniline, or hydroxyquinoline aluminum, or from any other non-metallic or semiconducting substrate materials that have substantially equal CTEs.

After the above elements have been provided, the active substrate is thermally coupled (805) to the passive substrate preferably by attaching the active substrate to the passive substrate using a thin adhesive, such as a conductive or non-conductive epoxy. In the preferred embodiment, the active substrate is attached to the passive substrate using one of several known semiconductor die attachment techniques. The thickness of the adhesive layer used to thermally couple the active substrate to the passive substrate should be less than or equal to approximately one-sixth the thickness of the active substrate in order to minimize any negative impact the adhesive layer may have on transferring heat between the two substrates. In the preferred embodiment, the thickness of the adhesive layer is approximately 0.050 millimeters, less than one-sixth the preferred thickness of the active substrate (approximately 0.320 millimeters).

In addition to thermal coupling the substrates together, the preferred active substrate is preferably attached (807) to the PCB substrate using known semiconductor die attachment techniques, and the heat-generating circuits of the active substrate (i.e., the circuits disposed on and/or in the active substrate that generate heat during operation) are electrically connected (809) to electrically conductive traces or pads disposed on a top surface of the PCB substrate. The electrical coupling of the heat-generating circuits to the PCB traces may be performed using any known technique, such as through the use of wire bonds or through the use of solder layers or conductive epoxy layers (e.g., in accordance with well-known flip chip technology).

When a heat sink is provided, the heat sink is preferably thermally coupled (811) to the top surface of the passive substrate or substrates in such a manner as to accommodate movement of the heat sink with respect to the passive substrate(s) over temperature, and the logic flow ends (813). Movement of the heat sink with respect to the passive substrate or substrates can occur due to the substantial-difference in the CTE of the heat sink as compared to the CTEs of the active and passive substrates. In the preferred embodiment, such thermal coupling is accomplished through the use of an external epoxy molding material surrounding the heat sink. The external epoxy molding material is attached to the PCB substrate of the IC package and compresses the heat sink against the passive substrate. The heat sink may also be connected to the PCB substrate to form an integrated circuit package in combination with the substrates, the adhesive layers, the PCB substrate and the wire bonds or other electrically conductive paths.

The present invention encompasses an integrated circuit package and a corresponding method of fabrication. With this invention, IC packages can include highly efficient internal heat spreaders without sacrificing package reliability. In contrast to prior art IC packages that include poor thermally conducting epoxy between an active semiconductor substrate and an internal heat sink, the present invention includes a highly conductive, passive substrate either between the active substrate and an internal heat sink or alone as an independent heat spreader. Thus, with the IC package of the present invention, improved heat spreading and thermal conductivity is provided compared to prior art packages. In addition, since the passive substrate has a CTE substantially equal to the CTE of the active substrate, package reliability is maintained over variations in temperature. Further, since another substrate is in close contact or proximity to the active substrate pursuant to the present invention, undesired short circuits and/or other undesired IC performance effects are avoided in contrast to the high likelihood of such undesired effects when connecting a metallic heat sink directly to the active substrate to improve heat spreading.

In the foregoing specification, the present invention has been described with reference to specific embodiments. However, one of ordinary skill in the art will appreciate that various modifications and changes may be made without departing from the spirit and scope of the present invention as set forth in the appended claims. For example, the single chip and multi-chip IC packages 400, 500 of FIGS. 4 and 5 may exclude an internal heat sink 411, 501 and rely only on the passive substrate(s) 409, 510, 511 for thermal conduction and heat spreading (e.g., in low power applications). In addition, the thicknesses of the semiconductor or other substrates used in each IC of the multi-chip IC package 500 and in each IC of the PCB arrangements 600, 700 may be different, even though such thicknesses were shown substantially equal in the FIGs. Of course, when a heat sink is employed, the total thickness or height of each IC, whether in the multi-chip IC package 500 or the PCB arrangements 600, 700, should be substantially equal to enable the heat sink to be properly thermally coupled to the passive substrates without requiring special manufacturing, extruded or specially-tooled heat sinks, or other costly processing. Accordingly, the specification and drawings are to be regarded in an illustrative rather than a restrictive sense, and all such modifications are intended to be included within the scope of the present invention.

Benefits, other advantages, and solutions to problems have been described above with regard to specific embodiments of the present invention. However, the benefits, advantages, solutions to problems, and any element(s) that may cause or result in such benefits, advantages, or solutions, or cause such benefits, advantages, or solutions to become more pronounced are not to be construed as a critical, required, or essential feature or element of any or all the claims. As used herein and in the appended claims, the term "comprises," "comprising," or any other variation thereof is intended to refer to a non-exclusive inclusion, such that a process, method, article of manufacture, or apparatus that comprises a list of elements does not include only those elements in the list, but may include other elements not expressly listed or inherent to such process, method, article of manufacture, or apparatus.

What is claimed is:

1. An integrated circuit package comprising:
    a first substrate having a first surface and a second surface, the first substrate including at least one heat-generating circuit and having a first coefficient of thermal expansion; and
    a second substrate having at least a first surface and a second coefficient of thermal expansion that is substantially equal to the first coefficient of thermal expansion, the first surface of the second substrate being thermally coupled to the second surface of the first substrate, the second substrate functioning to thermally conduct heat generated by the at least one heat-generating circuit away from the at least one heat-generating circuit;
    a metallic heat sink thermally coupled to the second surface of the second substrate, wherein a coefficient of thermal expansion of metallic heat sink is substantially different than the first coefficient of thermal expansion and the second coefficient of thermal expansion; and
    an external epoxy molding material disposed exterior to the metallic heat sink such that the metallic heat sink, the second substrate and the first substrate are fully encapsulated by the external epoxy molding material.

2. The integrated circuit package of claim 1, wherein the coupling between the metallic heat sink and the second substrate is such as to accommodate movement of the metallic heat sink with respect to the second substrate.

3. The integrated circuit package of claim 1, wherein the coefficient of thermal expansion of the metallic heat sink is approximately seven times greater than the first coefficient of thermal expansion and the second coefficient of thermal expansion.

4. The integrated circuit package of claim 1, further comprising:
    an adhesive layer having a first surface and a second surface, the first surface of the adhesive layer being physically connected to the second surface of the first substrate, the second surface of the adhesive layer being physically connected to the first surface of the second substrate, wherein a thickness of the adhesive layer is less than or equal to approximately one-sixth of a thickness of the first substrate and wherein the adhesive layer functions to thermally couple the first substrate to the second substrate and to position the second substrate in a fixed relation with respect to the first substrate.

5. The integrated circuit package of claim 1, further comprising:
    a printed circuit board substrate having at least a first surface, the printed circuit board substrate including at least one conductive trace;

an adhesive layer having a first surface and a second surface, the first surface of the adhesive layer being physically connected to the first surface of the printed circuit board substrate, the second surface of the adhesive layer being physically connected to the first surface of the first substrate, wherein the adhesive layer functions to at least position the first substrate in a fixed relation with respect to the printed circuit board substrate; and at least one electrically conductive path connecting the at least one heat-generating circuit to the at least one conductive trace.

6. The integrated circuit package of claim 5, wherein the adhesive layer comprises a conductive epoxy.

7. The integrated circuit package of claim 5, wherein the at least one electrically conductive path comprises at least one wire bond.

8. The integrated circuit package of claim 1, wherein a thickness of the second substrate is greater than a thickness of the first substrate.

9. The integrated circuit package of claim 1, wherein the first substrate comprises a first semiconductor material and wherein the second substrate comprises one of the first semiconductor material and a second semiconductor material.

10. An integrated circuit package comprising:

a first substrate having a first surface and a second surface, the first substrate including at least one heat-generating circuit and having a first coefficient of thermal expansion;

a second substrate having a first surface and a second surface, the second substrate having a second coefficient of thermal expansion that is substantially equal to the first coefficient of thermal expansion, the first surface of the second substrate being thermally coupled to the second surface of the first substrate, the second substrate functioning to thermally conduct heat generated by the at least one heat-generating circuit away from the at least one heat-generating circuit;

a printed circuit board substrate having at least a first surface, the printed circuit board substrate including at least one conductive trace;

a first adhesive layer having a first surface and a second surface, the first surface of the first adhesive layer being physically connected to the second surface of the first substrate, the second surface of the first adhesive layer being physically connected to the first surface of the second substrate, wherein a thickness of the first adhesive layer is less than or equal to approximately one-sixth of a thickness of the first substrate and wherein the first adhesive layer functions to thermally couple the first substrate to the second substrate and to position the second substrate in a fixed relation with respect to the first substrate;

a second adhesive layer having a first surface and a second surface, the first surface of the second adhesive layer being physically connected to the first surface of the printed circuit board substrate, the second surface of the second adhesive layer being physically connected to the first surface of the first substrate, wherein the second adhesive layer functions to at least position the first substrate in a fixed relation with respect to the printed circuit board substrate;

at least one electrically conductive path connecting the at least one heat-generating circuit to the at least one conductive trace;

a metallic heat sink thermally coupled to the second surface of the second substrate, wherein a coefficient of thermal expansion of the metallic heat sink is substantially different than the first coefficient of thermal expansion and the second coefficient of thermal expansion; and an external epoxy molding material disposed exterior to the metallic heat sink such that the metallic heat sink, the second substrate and the first substrate are fully encapsulated by the external epoxy molding material.

11. A method for fabricating an integrated circuit, the method comprising the steps of:

providing a first substrate, the first substrate including at least one heat-generating circuit and having a first coefficient of thermal expansion;

providing a second substrate, the second substrate having a second coefficient of thermal expansion that is substantially equal to the first coefficient of thermal expansion;

thermally coupling the first substrate to the second substrate, the second substrate thermally conducts heat generated by the at least one heat-generating circuit away from the at least one heat-generating circuit;

thermally coupling a metallic heat sink to a surface of the second substrate, wherein a coefficient of thermal expansion of the metallic heat sink is substantially different than the first coefficient of thermal expansion and the second coefficient of thermal expansion; and thermally coupling an external epoxy molding material exterior to the metallic heat sink such that the metallic heat sink, the second substrate and the first substrate are fully encapsulated by the external epoxy molding material.

12. The method of claim 11, wherein the step of thermally coupling the first substrate to the second substrate comprises the step of attaching the first substrate to the second substrate using an adhesive, wherein a thickness of the adhesive is less than or equal to approximately one-sixth of a thickness of the first substrate.

* * * * *